United States Patent
Rofougaran et al.

(10) Patent No.: US 8,649,753 B2
(45) Date of Patent: *Feb. 11, 2014

(54) METHOD AND SYSTEM FOR USING A MICROSTRIP TO SWITCH CIRCUITS IN CMOS APPLICATIONS

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 1105 days.

This patent is subject to a terminal disclaimer.

(21) Appl. No.: 11/864,771

(22) Filed: Sep. 28, 2007

(65) Prior Publication Data
US 2009/0088119 A1    Apr. 2, 2009

(51) Int. Cl.
*H04B 1/26* (2006.01)
*H04B 1/16* (2006.01)
*H03D 7/14* (2006.01)
*H03J 3/08* (2006.01)

(52) U.S. Cl.
CPC ............ *H03D 7/1441* (2013.01); *H03J 3/08* (2013.01)
USPC ............................ 455/323; 455/333; 455/340

(58) Field of Classification Search
USPC .......... 455/313, 318, 319, 323, 333, 339, 340
See application file for complete search history.

(56) References Cited

U.S. PATENT DOCUMENTS

| | | | | |
|---|---|---|---|---|
| 3,955,161 A | * | 5/1976 | MacTurk | 333/209 |
| 4,066,988 A | * | 1/1978 | Karp | 333/223 |
| 5,142,255 A | * | 8/1992 | Chang et al. | 333/204 |
| 5,908,811 A | * | 6/1999 | Das | 505/210 |
| 6,002,860 A | * | 12/1999 | Voinigescu et al. | 703/14 |
| 6,879,817 B1 | * | 4/2005 | Sorrells et al. | 455/296 |
| 6,999,745 B2 | * | 2/2006 | Leenaerts | 455/313 |
| 7,323,955 B2 | * | 1/2008 | Jachowski | 333/204 |
| 7,386,292 B2 | * | 6/2008 | Sorrells et al. | 455/313 |
| 7,496,342 B2 | * | 2/2009 | Sorrells et al. | 455/313 |
| 2003/0171107 A1 | * | 9/2003 | Sorrells et al. | 455/296 |
| 2003/0222732 A1 | * | 12/2003 | Matthaei | 333/99 S |
| 2004/0023628 A1 | * | 2/2004 | Tong et al. | 455/130 |

(Continued)

FOREIGN PATENT DOCUMENTS

| | | |
|---|---|---|
| EP | 0 539 133 | 4/1993 |
| EP | 1 278 265 | 1/2003 |
| JP | 10126174 | 5/1998 |

OTHER PUBLICATIONS

European Search Report corresponding to European Patent Application Serial No. 08015120.2-2215, dated Feb. 3, 2009.

George L. Matthaei, Narrow-Band, Fixed-Tuned, and Tunable Bandpass Filters with Zig-Zag Hairpin-Comb Resonators, IEEE Transactions on Microwave Theory and Techniques, Apr. 2003, pp. 1214-1219, vol. 51, No. 4.

(Continued)

*Primary Examiner* — Duc M Nguyen
(74) *Attorney, Agent, or Firm* — Farjami & Farjami LLP

(57) ABSTRACT

Aspects of a method and system for using a microstrip to switch circuits in CMOS applications may include generating a second signal from a first signal by frequency-translating the first signal by switching a first current associated with the first signal between a first signal path and a second signal path. The switched first current may be filtered via a microstrip filter that may be tuned to a desired frequency component of the frequency-translated first signal, and the second signal may be generated from the difference between the voltage of the first signal path and the second signal path.

24 Claims, 7 Drawing Sheets

(56) References Cited

U.S. PATENT DOCUMENTS

| | | | |
|---|---|---|---|
| 2004/0130414 A1* | 7/2004 | Marquardt et al. | 333/174 |
| 2004/0145954 A1* | 7/2004 | Toncich | 365/200 |
| 2005/0030132 A1* | 2/2005 | Shamsaifar et al. | 333/209 |
| 2005/0143042 A1* | 6/2005 | Sorrells et al. | 455/313 |
| 2006/0273869 A1 | 12/2006 | Jachowski | |
| 2009/0088105 A1* | 4/2009 | Rofougaran | 455/130 |
| 2009/0088107 A1* | 4/2009 | Rofougaran et al. | 455/151.2 |

OTHER PUBLICATIONS

Shau-Gang Mao and Yu-Zhi Chueh, Coplanar Waveguide Bandpass Filters With Compact Size an Wide Spurious-Free Stopband Using Electromagnetic Bandgap Resonators, IEEE Microwave and Wireless Components Letters, Mar. 2007, pp. 181-183, vol. 17, No. 3.

* cited by examiner

METHOD AND SYSTEM FOR USING A MICROSTRIP TO SWITCH CIRCUITS IN CMOS APPLICATIONS

CROSS-REFERENCE TO RELATED APPLICATIONS/INCORPORATION BY REFERENCE

Not applicable

FIELD OF THE INVENTION

Certain embodiments of the invention relate to wireless communication. More specifically, certain embodiments of the invention relate to a method and system for using a microstrip to switch circuits in CMOS applications.

BACKGROUND OF THE INVENTION

In 2001, the Federal Communications Commission (FCC) designated a large contiguous block of 7 GHz bandwidth for communications in the 57 GHz to 64 GHz spectrum. This frequency band may be used by the spectrum users on an unlicensed basis, that is, the spectrum is accessible to anyone, subject to certain basic, technical restrictions such as maximum transmission power and certain coexistence mechanisms. The communications taking place in this band are often referred to as '60 GHz communications'. With respect to the accessibility of this part of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. For example, 60 GHz signals may provide markedly different communications channel and propagation characteristics, not least due to the fact that 60 GHz radiation is partly absorbed by oxygen in the air, leading to higher attenuation with distance. On the other hand, since a very large bandwidth of 7 GHz is available, very high data rates may be achieved. Among the applications for 60 GHz communications are wireless personal area networks, wireless high-definition television signal, for example from a set top box to a display, or Point-to-Point links.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A method and/or system for using a microstrip to switch circuits in CMOS applications, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for using a microstrip to switch circuits in CMOS applications. Aspects of a method and system for a distributed transceiver for high frequency applications may comprise generating a second signal from a first signal by frequency-translating the first signal by switching a first current associated with the first signal between a first signal path and a second signal path. The switched first current may be filtered via a microstrip filter that may be tuned to a desired frequency component of the frequency-translated first signal, and the second signal may be generated from the difference between the voltage of the first signal path and the second signal path.

The microstrip filter may be a programmable bandpass filter or a programmable stopband filter, and the microstrip filter may be tuned to the harmonic frequency by tuning a center frequency of the microstrip filter. The center frequency may be configured by adjusting a capacitance and/or an inductance of the microstrip filter. The bandwidth of the microstrip bandwidth may be configured. The microstrip filter may comprise a programmable coplanar waveguide filter, for which the center frequency may be configured by adjusting a capacitance and/or an inductance of the programmable coplanar waveguide filter. The bandwidth of the programmable coplanar waveguide filter may be configured.

Figure 1:
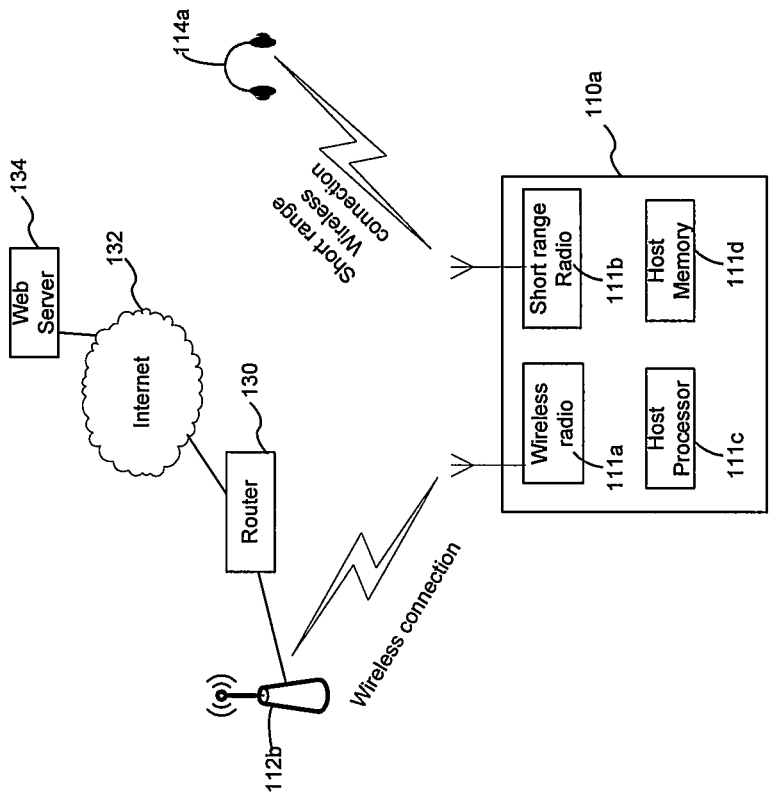
FIG. 1 is a diagram illustrating an exemplary wireless communication system, in connection with an embodiment of the invention.

FIG. 1 is a diagram illustrating an exemplary wireless communication system, in connection with an embodiment of the invention. Referring to FIG. 1, there is shown an access point 112b, a computer 110a, a headset 114a, a router 130, the Internet 132 and a web server 134. The computer or host device 110a may comprise a wireless radio 111a, a short-range radio 111b, a host processor 111c, and a host memory 111d. There is also shown a wireless connection between the wireless radio 111a and the access point 112b, and a short-range wireless connection between the short-range radio 111b and the headset 114a.

Frequently, computing and communication devices may comprise hardware and software to communicate using multiple wireless communication standards. The wireless radio 111a may be compliant with a mobile communications standard, for example. There may be instances when the wireless radio 111a and the short-range radio 111b may be active concurrently. For example, it may be desirable for a user of the computer or host device 110a to access the Internet 132 in order to consume streaming content from the Web server 134. Accordingly, the user may establish a wireless connection between the computer 11a and the access point 112b. Once this connection is established, the streaming content from the Web server 134 may be received via the router 130, the access point 112b, and the wireless connection, and consumed by the computer or host device 110a.

It may be further desirable for the user of the computer 110a to listen to an audio portion of the streaming content on the headset 114a. Accordingly, the user of the computer 110a may establish a short-range wireless connection with the headset 114a. Once the short-range wireless connection is established, and with suitable configurations on the computer enabled, the audio portion of the streaming content may be consumed by the headset 114a. In instances where such advanced communication systems are integrated or located within the host device 110a, the radio frequency (RF) generation may support fast-switching to enable support of multiple communication standards and/or advanced wideband systems like, for example, Ultrawideband (UWB) radio. Other applications of short-range communications may be wireless High-Definition TV (W-HDTV), from a set top box to a video display, for example. W-HDTV may require high data rates that may be achieved with large bandwidth communication technologies, for example UWB and/or 60-GHz communications.

Figure 2A:
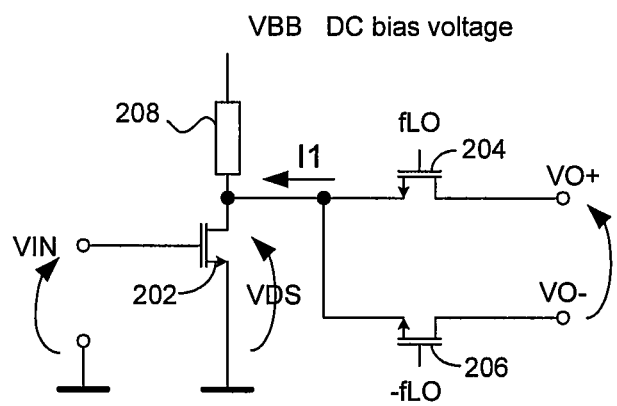
FIG. 2A is a circuit diagram illustrating an exemplary frequency conversion mixer, in accordance with an embodiment of the invention.

FIG. 2A is a circuit diagram illustrating an exemplary frequency conversion mixer, in accordance with an embodiment of the invention. Referring to FIG. 2A, there is shown FETs 202, 204 and 206, and a microstrip 208. There is also shown an input signal VIN, a drain-source voltage across FET 202 VDS, a current I1, local oscillator input signal fLO and −fLO, and output signals VO+ and VO−, and a DC bias voltage VBB.

The drain of the FET 202 may be communicatively coupled to the microstrip 208 and the sources of the FETs 204 and 206. The source of the FET 202 may be communicatively coupled, for example, to ground.

The circuit in FIG. 2A may be enabled to mix an input signal VIN with a local oscillator signal fLO and generate a differential output signal at VO+ and VO−. The input signal VIN may be, for example, a radio frequency (RF) signal, for example VIN=$V_B$+s(t)cos($w_0$t), where $V_B$ may be a DC bias voltage component, s(t) may be the information-bearing baseband or intermediate frequency signal and $w_0$ may be the angular carrier frequency of the RF signal VIN. The local oscillator may be, for example, a sinusoid fLO=A cos($w_{LO}$t), or a train of square-shaped pulses at a fundamental frequency $w_{LO}$. The microstrip 208 may comprise suitable logic, circuitry and/or code that may be enabled to generate a programmable, frequency-dependent impedance. For example, the microstrip 208 may be of very small impedance for low and high frequencies and may be of a very high impedance at some intermediate frequency $w_\mu$. The microstrip 208 may be of a large impedance in a narrow band of frequencies around the center frequency $w_\mu$, its bandwidth. The FETs 204 and 206 may be enabled to operate essentially as switches as may be described for FIG. 2B in more detail. The signal amplitude A of fLO may be much larger than the voltage required to switch the FETs 204 and 206 from on to off and vice versa. In these instances, the FET switches 204 and 206 may be in opposite states at a given time instance. For example, the FET 204 may be similar to a closed switch when FET 206 may be similar to an open switch, and vice versa. The switches generated by the FET 204 and FET 206 may lead to the current I1 to be either flowing from VO+ through FET 204, or from VO− through FET 206 at any given instance in time.

The DC voltage VBB may be used to bias the circuit illustrated in FIG. 2A. Since, as described above, the microstrip 208 may be of very low impedance at low frequencies, there will be almost no voltage drop across the microstrip 208 for the bias voltage VBB and the drain of the FET 202 will be DC-biased to approximately VBB.

Figure 2B:
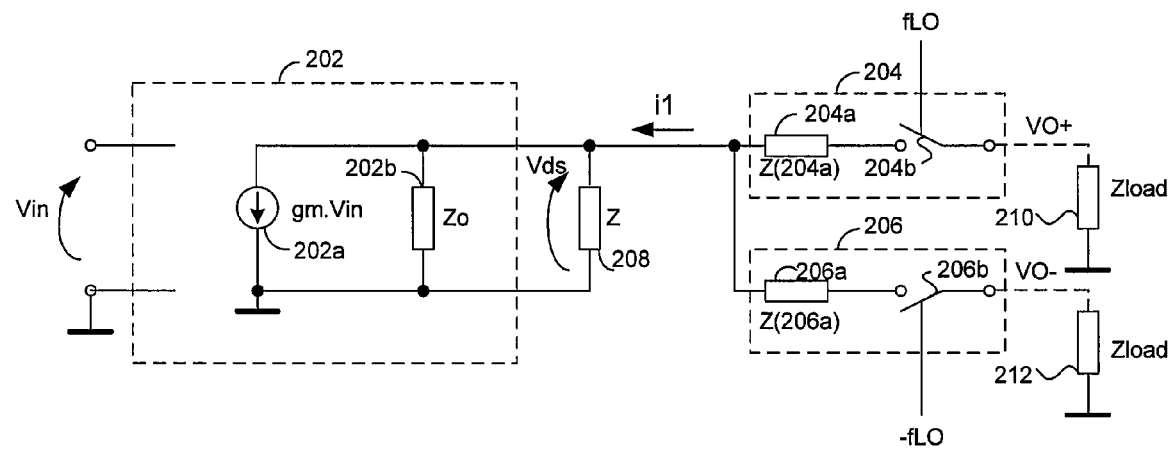
FIG. 2B is a small signal equivalent circuit illustrating functionality of the frequency conversion mixer, in accordance with an embodiment of the invention.

FIG. 2B is a small signal equivalent circuit illustrating functionality of the frequency conversion mixer, in accordance with an embodiment of the invention. Referring to FIG. 2B, there is shown an FET small signal model 202, and FET models 204 and 206. The FET small signal model 202 may be a model for the FET 202, the FET models 204 and 206 may be a model for the FETs 204 and 206, respectively, as illustrated in FIG. 2A. The FET small signal model 202 may comprise a current source 202a and an output impedance 202b. The FET model 204 may comprise an impedance 204a and a switch 204b. The FET model 206 may comprise an impedance 206a and a switch 206b. There is also shown the microstrip 208 and impedances 210 and 212. There is also shown an input voltage Vin, which may be the small signal component of VIN, for example, Vin=s(t)cos($w_0$t). There is also shown the small signal voltage Vds, the small signal current i1, the local oscillator signals fLO and −fLO, and the small signal output signals Vo+ and Vo−.

The impedances 210 and 212 may not be communicatively coupled to the circuit and are shown for illustrative purposes only, hence the dotted connection. The impedances 210 and 212 may represent, for example, or a further mixing stage, a differential signal amplifier.

The FET 202 may generate a current gm·Vin=gm·cos($w_0$t) in the current source 202a as a function of the input voltage Vin. Hence, the current i1 may be a function of the input voltage Vin. As shown in the FET model 204 and 206 and the described in FIG. 2A, the FETs 204 and 206 may be described as switches, in series with an output impedance 204a and 206a, respectively. Since FET 204 may be controlled by fLO and FET 206 may be controlled by −fLO, the switch 204b may be closed when the switch 206b may be open, and vice versa, at any given instance in time. The output signal of the mixer illustrated in FIG. 2 may be given by the differential signal Vo=(Vo+)−(Vo−). Since the current i1 flows through FET 204 or FET 206 alternatingly, the output voltage Vo may effectively be ±Vds, depending on which FET may be active. Hence, the output voltage Vo may be Vds with its polarity flipped at the rate that the FETs 204 and 206 may switch on and off. The on and off switching at the FETs 204 and 206 may be determined by the frequency fLO. Hence, the differential output signal Vo may effectively be proportional to the input signal Vin, multiplied by a bipolar square-shaped pulse train of fundamental frequency $w_{LO}$. Hence, the output signal Vo may be approximately given by the following relationship, under the assumption that the microstrip 208 may be a constant, frequency independent impedance:

$$Vo \propto i1 \cdot Zload \propto gm \cdot Vin \cdot fLO \cdot Zload = \quad (1)$$

$$gm \cdot \cos(w_0 t) \cdot \frac{4A}{\pi} \left[ \sum_{k=1}^{\infty} \frac{(-1)^{k-1}}{2k-1} \cos((2k-1)w_{LO} t) \right] Zload =$$

$$\frac{4A}{\pi} gm \left[ \frac{1}{2}\cos(w_0 t + w_{LO} t) + \frac{1}{2}\cos(w_0 t - w_{LO} t) + \right.$$

$$\left. \cos(w_0 t) \cdot \left[ \sum_{k=2}^{\infty} \frac{(-1)^{k-1}}{2k-1} \cos((2k-1)w_{LO} t) \right] \right] Zload$$

where the bipolar square wave may be written in terms of its Fourier series expansion.

Hence, as illustrated in the above equation, the output signal may comprise sum and difference terms of the input frequency $w_0$ and the local oscillator frequency $w_{LO}$ plus various other frequency components which may not be desired. In instances, where the frequency mixer may desire to downconvert a received signal, the desirable signal component may be the component comprising $\cos(w_0 t - w_{LO} t)$. In instances where the frequency mixer may desire to upconvert a received signal, the desirable signal component may be the component comprising $\cos(w_0 t + w_{LO} t)$.

The microstrip 208 may be used to filter out the undesirable signal components in equation (1). The signal in equation (1) may be approximately correct in the case where the microstrip 208 may be a frequency independent non-zero impedance, as described above. However, the impedance of microstrip 208 may be significantly greater than zero in a narrow bandwidth around the frequency it may be tuned to, $w_\mu$. In instances where, for example, the microstrip 208 may be tuned to $w_\mu = W_0 - w_{LO}$, the microstrip 208 may be essentially similar to a zero impedance (short circuit) for any frequency different from $w_\mu$. In this instance, any signal component in equation (1) that may be sufficiently far from $w_\mu$ in frequency may be shortened to ground, since for these frequencies, the impedance Z of the microstrip 208 may be zero. In these instances, a current may still flow through FET 204 and FET 206, due to the controlling signals fLO and -fLO. However, the currents through FET 204 and 206 may be flowing in opposite directions, so that the resulting voltage potentials may be given by Vo=(Vo+)-(Vo-)=0. Hence, the desired frequency component at $w_\mu$ may be the only frequency component from equation (1) that may generate a contribution to the differential output signal Vo. Hence, taking into account the frequency characteristics of the microstip 208, the final output voltage may be given by the following relationship, when $w_\mu = w_0 - w_{LO}$:

$$Vo \Big|_{w_\mu \approx w_0 - w_{LO}} \propto \frac{2A}{\pi} gm[\cos(w_0 t - w_{LO} t)] Zload$$

In addition to allowing precise filtering of the desired frequency components, usage of the microstrip 208 may be advantageous because the DC bias point may remain stable.

Figure 3A:
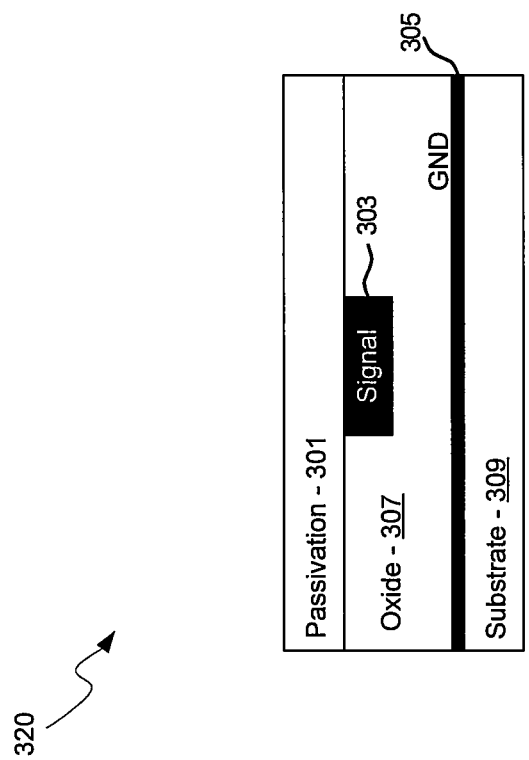
FIG. 3A is a block diagram illustrating a cross sectional view of a microstrip bandpass filter, in accordance with an embodiment of the invention.

FIG. 3A is a block diagram illustrating a cross-sectional view of a microstrip bandpass filter, in accordance with an embodiment of the invention. Referring to FIG. 3A, there is shown a microstrip bandpass filter (MS-BPF) 320. The MS-BPF 320 may comprise a passivation layer 301, a signal conductive line 303, a ground plane 305, an oxide layer 307 and a substrate 309.

The passivation layer 301 may comprise an oxide, nitride or other insulating layer that may provide electrical isolation between the signal conductive line 303, the ground plane 305 and other circuitry on the substrate 309. The passivation layer 301 may provide protection from environmental factors for the underlying layers of the MS-BPF 320. In addition, the passivation layer 301 may be selected based on its dielectric constant and its effect on the electric field that may be present between conductive lines.

The signal conductive line 303 may comprise metal traces embedded in the oxide layer 307. In another embodiment of the invention, the signal conductive line 303 may comprise poly-silicon or other conductive material. The separation and the voltage potential between the signal conductive line 303 and the ground plane 305 may determine the electric field generated therein. In addition, the dielectric constant of the oxide 307 may also determine the electric field between the signal conductive line 303 and the ground plane 305.

The oxide layer 307 may comprise $SiO_2$ or other oxide material that may provide a high resistance insulating layer between the signal conductive line 303 and the ground plane 305. In addition, the oxide layer 307 may provide a means for configuring the electric field between the signal conductive line 303 and the ground plane 305 by the selection of an oxide material with an appropriate dielectric constant.

The substrate 309 may comprise a semiconductor or insulator material that may provide mechanical support for the MS-BPF 320 and other devices that may be integrated. The substrate 309 may comprise Si, GaAs, sapphire, InP, GaO, ZnO, CdTe, CdZnTe and/or $Al_2O_3$, for example, or any other substrate material that may be suitable for integrating microstrip structures.

In operation, an AC signal may be applied across the signal conductive line 303 and the ground plane 305. The spacing between the conductive line 303 and the ground plane 305, as well as the pattern of the conductive lines, may generate an inductance and a capacitance that may be utilized for filtering purposes, specifically bandpass filtering, in the present invention. In addition, programmable impedances may be coupled across the microstrip devices in the MS-BFP 320 to tune the center frequency and bandwidth and will be described further with respect to FIG. 3B.

Figure 3B:
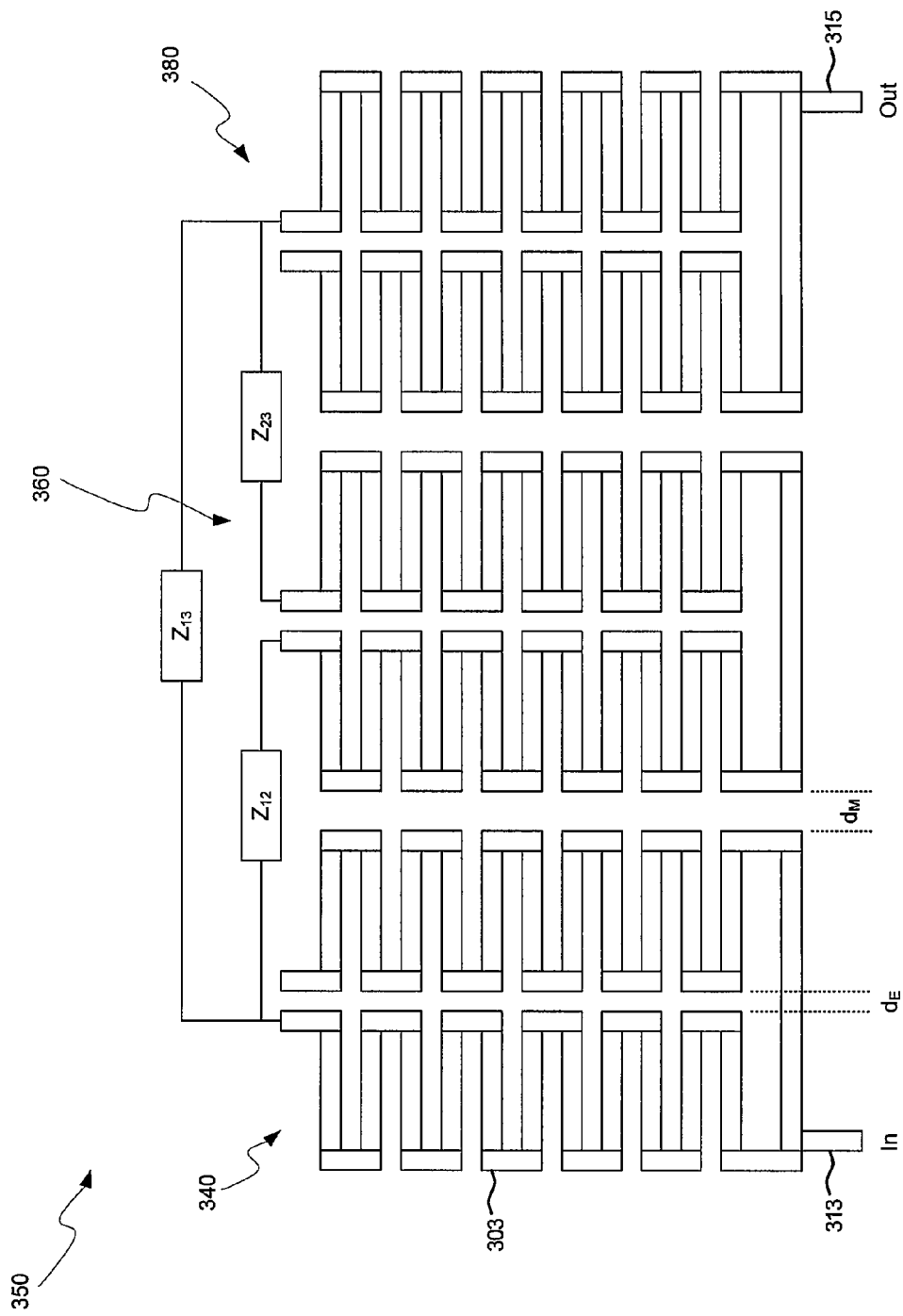
FIG. 3B is a block diagram of an exemplary microstrip bandpass filter, in accordance with an embodiment of the invention.
Figure 3C:
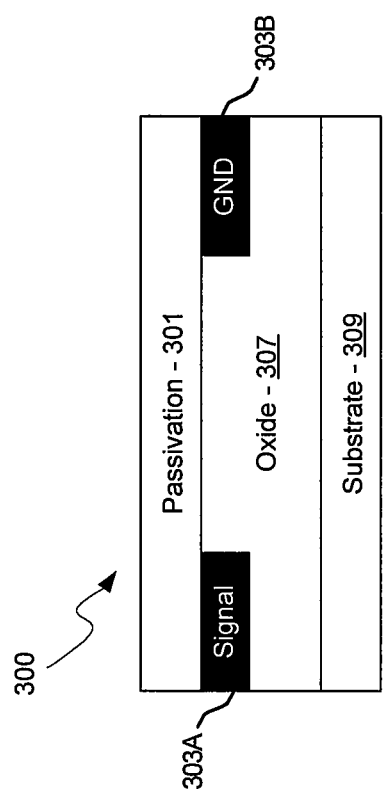
FIG. 3C is a block diagram illustrating a cross sectional view of a coplanar waveguide bandpass filter, in accordance with an embodiment of the invention.

FIG. 3B is a block diagram of an exemplary microstrip bandpass filter, in accordance with an embodiment of the invention. Referring to FIG. 3C, there is shown a microstrip bandpass filter 350 comprising three resonator sections 340, 360 and 380, an input coupler 313 and an output coupler 315. Each resonator section 340, 360 and 380 may comprise a pattern of signal conductive line 303. In addition, there is shown programmable impedances $Z_{12}$, $Z_{23}$ and $Z_{13}$. The pattern of signal conductive line 303 is an exemplary embodiment. The invention is not limited to this type of structure, as any number of patterns may be utilized to create a bandpass filter. Changing the shape may change the frequency response of the MS-BPF 350. In this manner, the frequency response may be tuned to a particular range with the design of the signal conductive line 303, and fine tuning may be accomplished by adjusting the programmable impedances $Z_{12}$, $Z_{23}$ and $Z_{13}$.

The signal conductive line 303 may be as described with respect to FIG. 3A. The programmable impedances may comprise inductors and/or capacitors that may be programmably adjusted to modify the center frequency and bandwidth of the MS-BPF 350. The number and location of the impedances $Z_{12}$, $Z_{23}$ and $Z_{13}$ is not limited to the configuration shown in FIG. 3B. Accordingly, any number of impedances may be used at multiple locations within the MS-BPF 350.

The input and output couplers 313 and 315 may comprise inductive tap couplings for communicating signals into and out of the MS-BPF 350, respectively. In another embodiment of the invention, the input and output couplers 313 and 315 may comprise series-capacitance couplers.

In operation, an input signal may be communicated to the MS-BPF 350 via the input coupler 313. The desired frequency of operation may be configured by adjusting the impedances of the programmable impedances $Z_{12}$, $Z_{23}$ and $Z_{13}$. The filtered output signal may be communicated from the output coupler 315. In another embodiment of the invention, tuning may be accomplished by suspending portions of the MS-BPF 350 over the substrate with an air gap. By adjusting this air gap, via piezoelectric or electrostatic means, for example, the capacitance of the structure may be altered, adjusting the bandpass filter frequency.

FIG. 3C is a block diagram illustrating a cross-sectional view of a coplanar waveguide bandpass filter, in accordance with an embodiment of the invention. Referring to FIG. 3C, there is shown a coplanar waveguide bandpass filter (CPW-BPF) 300. The CPW-BPF 300 may comprise a passivation layer 301, a signal conductive line 303A, a ground conductive line 303B, an oxide layer 307 and a substrate 309.

The passivation layer 301 may comprise an oxide, nitride or other insulating layer that may provide electrical isolation between the conductive lines 303A and 303B and other circuitry on the substrate 309. The passivation layer 301 may provide protection from environmental factors for the underlying layers of the CPW-BPF 300. In addition, the passivation layer 301 may be selected based on its dielectric constant and its effect on the electric field that may be present between conductive lines.

The signal and ground conductive lines 303A and 303B may comprise metal traces embedded in the oxide layer 307. In another embodiment of the invention, the conductive lines may comprise polysilicon or other conductive material. The separation and the voltage potential between the signal conductive line 303A and the ground conductive line 303B, as well as the dielectric constant of the oxide 307 may determine the electric field generated therein.

The oxide layer 307 may comprise $SiO_2$ or other oxide material that may provide a high resistance insulating layer between the signal conductive line 303A and the ground conductive line 303B. In addition, the oxide layer 307 may provide a high resistance insulating layer between the substrate 309 and the conductive lines 303A and 303B.

The substrate 309 may comprise a semiconductor or insulator material that may provide mechanical support for the CPW-BPF 300 and other devices that may be integrated. The substrate 309 may comprise Si, GaAs, sapphire, InP, GaO, ZnO, CdTe, CdZnTe and/or $Al_2O_3$, for example, or any other substrate material that may be suitable for integrating coplanar waveguide structures.

In operation, an AC signal may be applied across the signal conductive line 303A and the ground conductive line 303B. The spacing between the conductive lines as well as the pattern of the conductive lines may generate an inductance and a capacitance that may be utilized for filtering purposes, specifically bandpass filtering, in the present invention. In addition, programmable impedances may be coupled across coplanar waveguide devices in the CPW-BFP 300 to tune the center frequency and bandwidth, and will be described further with respect to FIG. 3D.

Figure 3D:
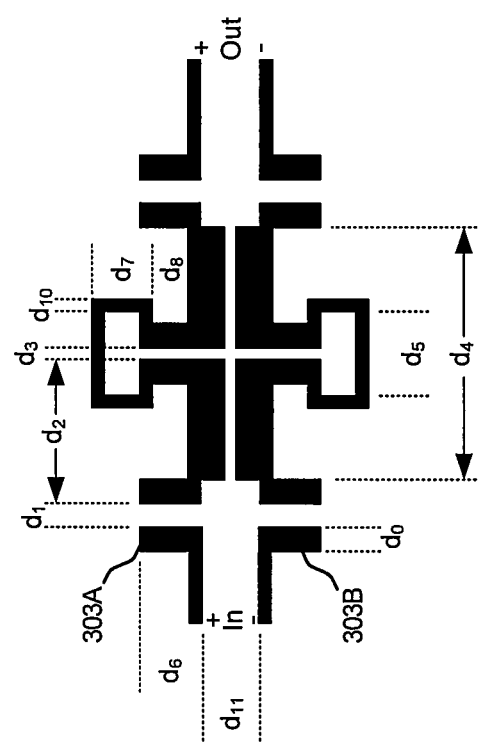
FIG. 3D is a block diagram of an exemplary coplanar waveguide bandpass filter, in accordance with an embodiment of the invention.

FIG. 3D is a block diagram of an exemplary coplanar waveguide bandpass filter, in accordance with an embodiment of the invention. Referring to FIG. 3D, there is shown a coplanar waveguide bandpass filter 325 comprising the signal conductive line 303A and the ground conductive line 303B embedded within an oxide layer and covered with a passivation layer as described with respect to FIG. 3C. The signal conductive line 303A may be as described with respect to FIG. 3C. The pattern of the signal conductive line 303A and the ground conductive line 303B is an exemplary embodiment. The invention is not limited to this type of structure, as any number of patterns may be utilized to create a bandpass filter. The CPW-BPF 325 may be designed for a particular frequency range by determining appropriate values for the dimensions $d_0$–$d_{11}$.

In operation, an input signal may be communicated to the CPW-BPF 325 at the plus and minus inputs labeled as "In" in FIG. 3D. The desired frequency of operation may be configured by the design of the conductive lines 303A and 303B. Changing the shape may change the frequency response of the CPW-BPF 325. In this manner, the frequency response may be tuned to a particular range with the design of the signal conductive line 303A and the ground conductive line 303B. Tuning may be accomplished by adjusting the dimensions of the structure, via switching sections in and out of the structure, for example. In another embodiment of the invention, tuning may be accomplished by suspending portions of the CPW-BPF 325 over the substrate with an air gap. By adjusting this air gap, via piezoelectric or electrostatic means, for example, the capacitance of the structure may be altered, adjusting the bandpass filter frequency. The filtered output signal may be communicated out of the CPW-BPF 325 at the plus and minus outputs labeled as "Out" in FIG. 3D.

In accordance with an embodiment of the invention, a method and system for using a microstrip to switch circuits in CMOS applications may comprise generating a second signal, for example $V_o$, from a first signal, for example $V_{IN}$ by frequency-translating the first signal by switching a first current, for example i1, associated with the first signal between a first signal path and a second signal path, as shown in FIG. 2A and FIG. 2B. The switched first current may be filtered via a microstrip filter, for example microstrip 208, that may be tuned to a desired frequency component of the frequency-translated first signal, for example the sum or difference component, and the second signal may be generated from the difference between the voltage of the first signal path, for example Vo +, and the second signal path, for example Vo−.

The microstrip filter may be a programmable bandpass filter, as described in FIG. 3B, for example, or a programmable stopband filter, and the microstrip filter may be tuned to the harmonic frequency by tuning a center frequency of the microstrip filter, as illustrated in FIG. 3B. The center frequency may be configured by adjusting a capacitance and/or an inductance of the microstrip filter, as described for FIG. 3A, FIG. 3B, FIG. 3C and FIG. 3D. The bandwidth of the microstrip bandwidth may be configured. The microstrip filter may comprise a programmable coplanar waveguide filter, for which the center frequency may be configured by adjusting a capacitance and/or an inductance of the programmable coplanar waveguide filter. The bandwidth of the programmable coplanar waveguide filter may be configured.

Another embodiment of the invention may provide a machine-readable storage, having stored thereon, a computer program having at least one code section executable by a machine, thereby causing the machine to perform the steps as described above for a method and system using a microstrip to switch circuits in CMOS applications.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
    generating a second signal from a first signal by:
        frequency-translating said first signal by switching a first current associated with said first signal between a first signal path and a second signal path;
        filtering said switched first current via a microstrip filter or a coplanar waveguide filter tuned to a desired frequency component of said frequency-translated first signal, wherein said microstrip filter or said coplanar waveguide filter is programmable by dynamically adjusting an inductance of one or more inductors physically connecting a plurality of resonator sections to one another within said microstrip filter or said coplanar waveguide filter, wherein said microstrip filter or said coplanar waveguide filter is coupled to said first signal path and said second signal path;
        applying a DC bias voltage to said microstrip filter or said coplanar waveguide filter; and
        generating said second signal from the difference between the voltage of said first signal path and said second signal path.

2. The method according to claim 1, wherein said microstrip filter is a programmable bandpass filter or a programmable stopband filter.

3. The method according to claim 2, comprising configuring a bandwidth of said microstrip filter.

4. The method according to claim 1, wherein said microstrip filter is tuned to said harmonic frequency.

5. The method according to claim 4, comprising tuning said harmonic frequency by configuring a center frequency of said microstrip filter.

6. The method according to claim 5, comprising adjusting an inductance of said microstrip filter for said configuring of said center frequency.

7. The method according to claim 1, wherein said coplanar waveguide filter is a programmable bandpass filter or a programmable stopband filter.

8. The method according to claim 7, comprising configuring a center frequency of said programmable coplanar waveguide filter.

9. The method according to claim 8, comprising adjusting a capacitance of said programmable coplanar waveguide filter for said configuring of said center frequency.

10. The method according to claim 8, comprising adjusting an inductance of said programmable coplanar waveguide filter for said configuring of said center frequency.

11. The method according to claim 7, comprising configuring a bandwidth of said programmable coplanar waveguide filter.

12. A system for processing communication signals, the system comprising:
    one or more circuits, said one or more circuits enabling:
    generation of a second signal from a first signal by:
        frequency-translation of said first signal by switching a first current associated with said first signal between a first signal path and a second signal path;
        filtering of said switched first current via a microstrip filter or a coplanar waveguide filter tuned to a desired frequency component of said frequency-translated first signal, wherein said microstrip filter or said coplanar waveguide filter is programmable by dynamically adjusting an inductance of one or more inductors physically connecting a plurality of resonator sections to one another within said microstrip filter or said coplanar waveguide filter, wherein said microstrip filter or said coplanar waveguide filter is coupled to said first signal path and said second signal path;
        applying a DC bias voltage to said microstrip filter or said coplanar waveguide filter; and
        generation of said second signal from the difference between the voltage of said first signal path and said second signal path.

13. The system according to claim 12, wherein said microstrip filter is a programmable bandpass filter or a programmable stopband filter.

14. The system according to claim 13, wherein said one or more circuits configure a bandwidth of said microstrip filter.

15. The system according to claim 12, wherein said microstrip filter is tuned to said harmonic frequency.

16. The system according to claim 15, wherein said one or more circuits comprise tuning said harmonic frequency by configuring a center frequency of said microstrip filter.

17. The system according to claim 16, wherein said one or more circuits adjust a capacitance of said microstrip filter for said configuring of said center frequency.

18. The system according to claim 16, wherein said one or more circuits adjust an inductance of said microstrip filter for said configuring of said center frequency.

19. The system according to claim 12, wherein said coplanar waveguide filter comprises a programmable bandpass filter or a programmable stopband filter.

20. The system according to claim 19, wherein said one or more circuits configure a center frequency of said programmable coplanar waveguide filter.

21. The system according to claim 20, wherein said one or more circuits adjust a capacitance of said programmable coplanar waveguide filter for said configuring of said center frequency.

22. The system according to claim 20, wherein said one or more circuits adjust an inductance of said programmable coplanar waveguide filter for said configuring of said center frequency.

23. The system according to claim 19, wherein said one or more circuits configure a bandwidth of said programmable coplanar waveguide filter.

24. A system for processing communication signals, the system comprising:
    one or more circuits comprising a field-effect transistor (FET), a microstrip filter or a coplanar waveguide filter coupled to said FET at a node, a DC bias voltage coupled to said microstrip filter or said coplanar waveguide filter, a first switching device and a second switching device coupled to said FET at said node;

said FET being operable to convert a received voltage signal to a current signal;

said first switching device and said second switching device being operable to frequency-translate said received voltage signal to produce a frequency-translated voltage signal by switching said current signal between a first signal path corresponding to said first switching device and a second signal path corresponding to said second switching device; and said microstrip filter or said coplanar waveguide filter being operable to filter said switched current signal, wherein:

a drain of said FET is DC-biased to said DC bias voltage;

said microstrip filter or said coplanar waveguide filter is programmable by dynamically adjusting an inductance of one or more inductors physically connecting a plurality of resonator sections to one another within said microstrip filter or said coplanar waveguide filter; and said frequency-translated voltage signal is the difference between a voltage produced at said first signal path and a voltage produced at said second signal path.

* * * * *